United States Patent [19]

Cane

[11] Patent Number: 5,606,911
[45] Date of Patent: Mar. 4, 1997

[54] SCREEN PRINTING STENCIL

[76] Inventor: Paul Cane, 12 Brackendale Ave., Preston, Weymouth, Dorset, Great Britain, DT3 68X

[21] Appl. No.: 411,773
[22] PCT Filed: Sep. 30, 1993
[86] PCT No.: PCT/GB93/02041
§ 371 Date: Jul. 3, 1995
§ 102(e) Date: Jul. 3, 1995
[87] PCT Pub. No.: WO94/07697
PCT Pub. Date: Apr. 14, 1994

[30] Foreign Application Priority Data

Oct. 1, 1992 [GB] United Kingdom ............ 9220700

[51] Int. Cl.⁶ .................................. B41N 1/24
[52] U.S. Cl. ............................ 101/127; 101/127.1
[58] Field of Search ................... 101/127, 128.4, 101/127.1

[56] References Cited

U.S. PATENT DOCUMENTS 2,925,774  2/1960  Scheeler ....................... 101/127.1

FOREIGN PATENT DOCUMENTS 1012371   7/1952  France .
1068277  11/1959  Germany .
3045241   1/1982  Germany .
3205541   8/1983  Germany .
3227434   1/1984  Germany .
3236761   5/1984  Germany .
3245346   6/1984  Germany .

*Primary Examiner*—Edgar S. Burr
*Assistant Examiner*—Daniel J. Colilla
*Attorney, Agent, or Firm*—Brooks & Kushman P.C.

[57] ABSTRACT

A stencil which is adapted for mounting in tension on a mount having peripheral regions which define a body portion for receiving the stencil pattern and which are held in the mount for creating tension in the stencil. A band-form region of weakness for relieving stencil strain is provided inwardly of one of the peripheral regions and extends across the stencil width to relieve the strain in the stencil foil when the mount is in tension. Further, the stencil includes a stencil foil defined by a thin metallic sheet adapted to be directly mounted on the mount which has a row of mounting apertures provided in the two peripheral regions for cooperating with pins in the mount, thereby permitting the foil to be stored separately from the mount. The region of weakness includes a pattern of strain-relief zones which are smaller than the mounting apertures therein and which define lands between successive zones in the lengthwise direction of the band-form region of weakness to transmit tension across the width of the region of weakness.

6 Claims, 2 Drawing Sheets

SCREEN PRINTING STENCIL

This invention relates to screen printing and is particularly concerned with screen stencils used in such a process.

Screen printing is well-known whereby ink, paint or other media is passed through apertures formed in a stencil onto the surface of a substrate.

The same process is used in the preparation of printed circuit boards where an amount of solder paste is deposited on the stencil and is then squeegeed through the apertures to the surface of a printed circuit board positioned therebelow. The stencil is usually made of thin stainless steel or other suitable metal foil.

Because of the demands for extreme accuracy in solder printing of circuit boards, the stencil is precisely positioned within a frame under tension and the frame is mounted in position on parts of the printing machine. Various methods of applying tension to the stencil are known.

In one current practice a pre-tensioned mesh is first bonded to a rigid framework, the perimeter of the stencil foil is bonded to the mesh and then the mesh is removed from the printing area. Thus the tension present in the mesh is transmitted to the stencil foil. This system is complicated, time consuming and therefore costly. Furthermore the stencil foil and the frame become a semi-permanent assembly which demands substantial storage space, each stencil requiring a separate frame.

In an attempt to overcome that problem an arrangement has been devised and is shown in PCT patent specification 92/08616 whereby edgemost portions of the stencil foil are formed with slots which are located over studs on the frame. The frame is then placed in tension pneumatically to rigidify the foil to some degree. However, it is found that in this arrangement the tension is unevenly distributed across the foil giving rise to so-called "strain lines" with consequent distortion of the apertures and inaccurate deposition of solder paste onto the printed circuit boards.

In a further method, described herein and in our co-pending PCT patent application number PCT/GB93/02040 published as WO 94/07696, a self-tensioning mount or frame for a stencil foil engages the foil at opposite ends of the frame, and the foil is tensioned by cam or the like means acting uniformly across the width of the stencil, so as to raise or lower same with respect to the frame, while the ends of the stencil remain clamped in the frame.

There is disclosed in Patent Abstracts of Japan publication number JP2295793 a screen plate for printing in which the screen plate is fixed at opposite ends to a frame. On one side only of the printing pattern in the plate there is formed an elastic part of the plate positioned in-line with the printing pattern and being somewhat wider than it, this elastic part being provided to avoid deformation of the printing pattern by the squeegee when the latter advances from the elastic part over the pattern to the corresponding non-elastic part. The pre-characterising portion of claim 1 hereof is based upon the disclosure in this prior publication.

An object of the present invention is to provide a stencil in the form of a metallic foil adapted to be mounted directly on a self-tensioning mount or frame by means of a row of apertures formed in the stencil foil to co-operate with corresponding pins or the like, wherein the technical effect of strain or tension lines which tend to be produced in the stencil upon tensioning is mitigated or overcome.

In an embodiment there is provided a stencil foil for mounting in tension on a mount therefor, the foil being formed with one or more regions of weakness located in the region of at least one edge of the foil.

The region of weakness is spaced inwardly from an edge of the foil and extends generally parallel to said edge of the foil. The region of weakness is formed by an array of perforations. Alternatively, the region of weakness may be provided by removing some of the material of the foil from a surface thereof, in order to reduce the cross-sectional thickness of the foil in the weakened region. Such thinning of the foil may be provided instead of or in addition to the perforations mentioned above.

End regions of the foil are clamped to the mount or frame, and the weakened regions of the foil provide strain relief so as to control the tension in the foil.

In an embodiment, the regions of weakness are located in portions of the foil which are spaced from the body portion of the foil which is to receive the stencil pattern. Generally, the regions of weakness are at the periphery of the body portion of the foil which is to receive the stencil pattern, but for certain applications, there might be a benefit to be obtained by a modified disposition of the zone or zones of weakness, without compromising the function of a known stencil pattern.

Generally, the regions of weakness are disposed so as to cross (for example of an angle of between 45 and 135 degrees) the general direction of the tension set up in the foil during use, between its opposed edges held in the mount therefor. Since the stencil pattern has an effect on the tendency for strain lines to be produced in the foil, it may be beneficial for the region of weakness to be disposed or constructed so as to be related to characteristics such as the disposition, size or shape of the stencil pattern, or indeed with respect to its effect on the tension pattern produced in the foil during use.

The above and other features of the invention will become clear from the following description which is given by way of example with reference to the accompanying drawings in which.

Figure 1:
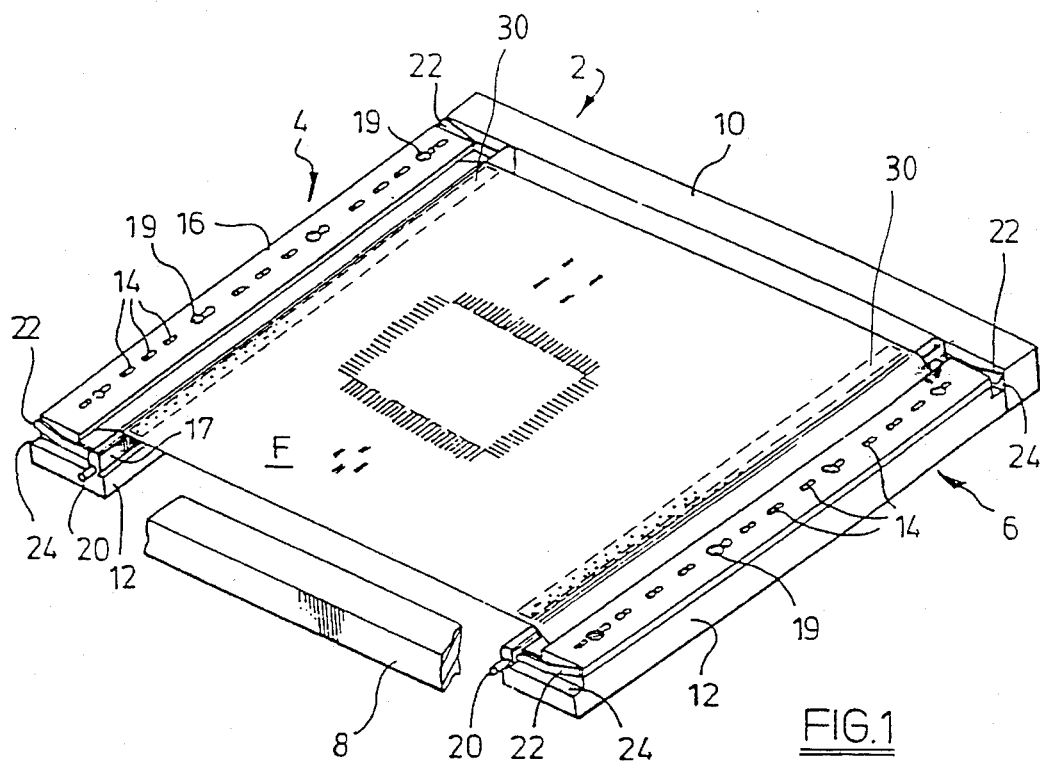
FIG. 1 is a perspective view of the stencil foil assembled with respect to the frame in its tensioned state, parts being removed for clarity.

As seen in the drawings a stencil/frame assembly in accordance with the invention comprises a frame 2 having front and rear frame members 4 and 6 respectively and left and right-hand frame members 8, 10.

Figure 2:
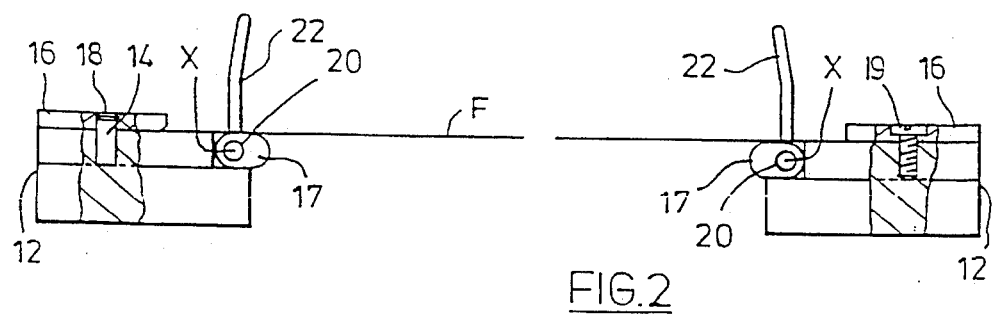
FIG. 2 is a cross-section through an assembled frame and stencil member in its untensioned condition.
Figure 3:
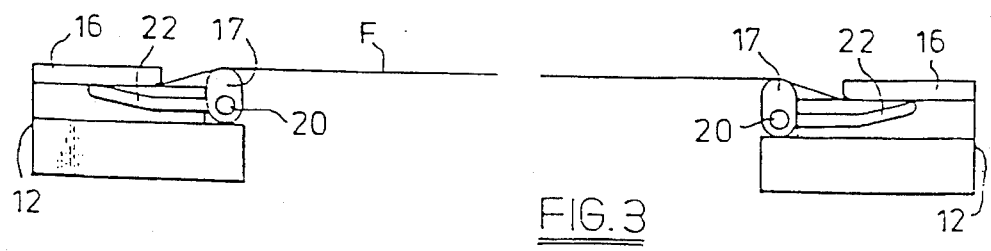
FIG. 3 is a cross-section similar to FIG. 2 but in its tensioned condition.

As seen clearly in FIG. 3 each of the front and rear frame members 4 and 6 comprises a main elongate base member 12 which is attached at its ends to the side members 8, 10. Locating pins 14 project upwardly from the members 12 seen FIG. 2 and a clamping bar 16 is formed with elongate holes 18 which align with the pins 14. Clamping screws 19 pass through clearance holes 21 in the bars 16 into threaded holes in the base members 12. The clearance holes in the clamping bars are conveniently formed as key-hole slots for rapid release and replacement of the bars.

Elongate bars 17, having cam shaped profile sections, extend the length of the base member 12 and are pivotally mounted by pins 20 which are rotatable about the axis X in holes formed in the side members 8, 10. Handles 22 are fixed to and project from the end portions of the cam shaped bars and recesses 24 are formed in the ends of the base members 12 to accommodate those handles when they are in operative tensioning position.

The stencil foil F is formed with location holes 26 towards its front and rear edges and the centre distances of these holes are coincident with the centre distances of the locating pins 14 in the base member 12. Further holes 28 are formed in the foil to coincide with the clamping screws 19.

Figure 4:
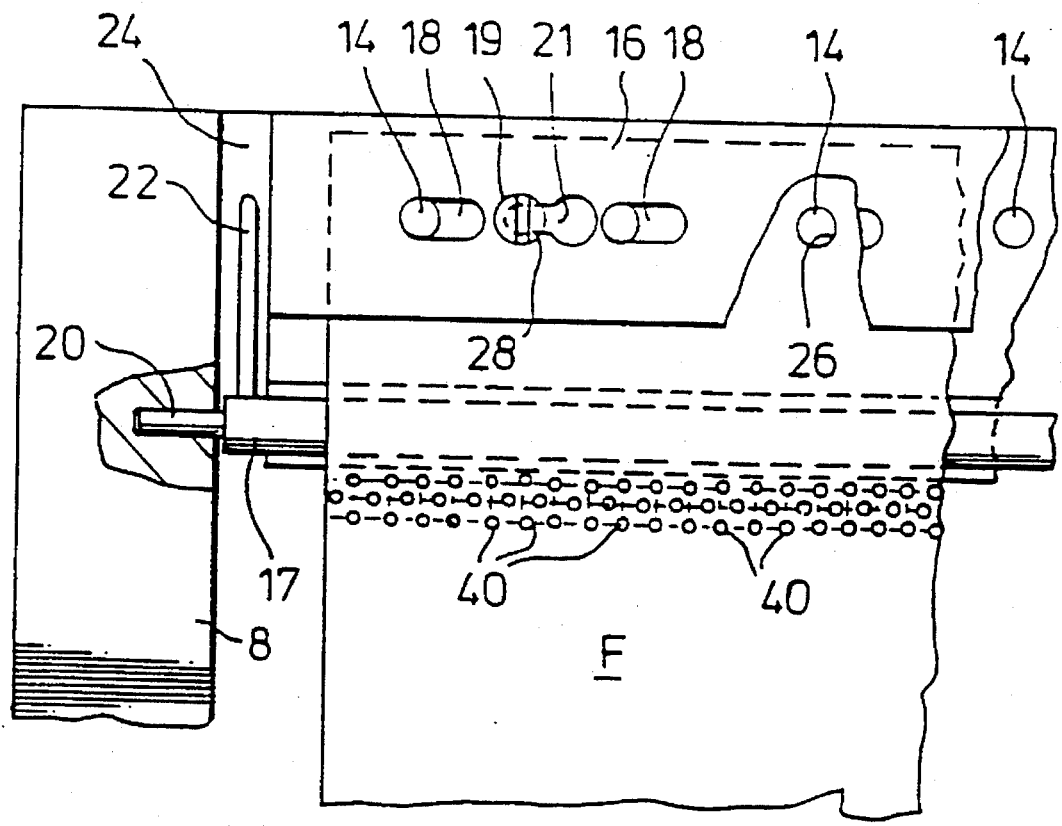
FIG. 4 is a detail plan view of part of the assembly shorting particularly details of one strain relief system according to the invention.

To mount the stencil foil F on the frame 2 the clamping screws 19 are first unscrewed by one or two turns after which the clamping bars 16 are moved to the left as seen in FIG. 4 and then lifted off their respective base members 12, the heads of the screws 19 passing through the large diameter of the key-hole slots.

At this time the cams 17 are in their generally horizontal position as seen clearly in FIG. 2.

The stencil foil F is then positioned on the frame by locating the holes 26 over the pins 14 on both the forward and rearward base members 12 after which the clamping bars are replaced in position and the screws 19 tightened. The foil is thus clamped between the front and rear frames 4 and 6.

In order to place the foil in tension the handles 22 are pushed downwardly to their substantially horizontal position, thereby rocking the cam bars 17 about the axes of their pivot pins 20 to the position shown in FIG. 3. This effectively raises the central part of the foil above its original plane, stretching it to tension the foil and hence rigidify it to a required degree to ensure accuracy of location of the apertures above the area of the printed circuit board to be printed.

The ready location and clamping of the stencil foil means that only the foils themselves need to be stored, rather than the complete assembly of foils and frames generally, thus saving storage space and reducing the risk of damage in moving the assemblies to and from their storage facility.

As seen clearly in FIGS. 1 and 4 regions of the stencil adjacent its ends are formed with rows of small diameter holes 40. This has the effect of relieving the strain imposed on the main area of the foil. It is found that by providing these strain relief holes, the tendency of strain lines appearing on the foil is eliminated. Alternatively, similar strain relief may be effected by reducing the cross-sectional area of the foil in that vicinity, shown as region 30 marked by dotted outline in FIG. 1, e.g. by etching away part of the metal.

This same technique is effective however the foil is tensioned. For example, when a pneumatically operated frame tensioning arrangement is used the array of holes is provided adjacent the endmost portions of the foil to alleviate the formation of strain lines on the tensioned foil.

The holes or other reduced cross-section arrangement may be formed at one or both end portions of the stencil foil. Further, there may be a number of rows of holes or only one row, and the position, shape, and size of the holes may be varied according to the degree of tension required, or the gauge thickness of the foil being used.

Furthermore, although it is preferable that the foil made of a suitable metal, e.g. a stainless steel alloy, the invention may be applied to any stencils, no matter which material is used.

It is found that the use of a stencil foil equipped the strain relief system as described enables accurate undistorted location of the printing media on to the substrate. This is particularly advantageous in the printing of solder paste on to printed circuit boards.

I claim:

1. A stencil (F) for mounting in tension on a mount (2) therefor, said stencil comprising:

a) a body portion to receive a stencil pattern;

b) at least two peripheral regions defining said body portion and adapted to be held in said mount for the application of tension to said body portion;

c) a region of weakness formed in a defined location of said stencil (F) and located inwardly of one of said peripheral regions, to relieve strain in said stencil in use;

characterised by d) said stencil (F) comprising a stencil foil comprising a thin metallic sheet adapted itself to be directly mounted on said mount; and e) said stencil foil (F) being adapted for use in a self-tensioning mount or frame and comprising a row of mounting apertures (26) formed in said foil at said two peripheral regions of said stencil and extending lengthwise thereof to co-operate with corresponding mounting pins (14) of said mount or frame (2), whereby said stencil foil can be stored separately from said mount and then mounted thereon; and f) said region of weakness being located between said row of mounting apertures (26) and the part of said body portion to receive or having said stencil pattern, and said region of weakness extending across the full width of said stencil (F) at said relevant peripheral region thereof in the form of a band to relieve the strain in said stencil foil (F) produced by said mounting pins (14) and mounting apertures (26) upon self-tensioning of said stencil by said mount or frame; and g) said band-form region of weakness comprises a pattern of strain-relief zones (40) disposed with a plurality of said strain-relief zones provided both across the lateral width of said band-form region of weakness and lengthwise thereof; and h) the size of said strain-relief zones (40) being substantially smaller than said mounting apertures (26) therein such that a plurality of said zones (40) would fit within one of said mounting apertures (26); and i) the size and relative disposition and spacing of said strain-relief zones (40) in said region of weakness being such that a plurality of said strain-relief zones (40) are disposed so as to be within or to be crossed by the lengthwise strips of said stencil defined by parallel construction lines drawn at opposite sides of each of said mounting apertures (26); and j) said pattern of strain relief zones (40) defining lands between successive zones (40) in the lengthwise direction of said band-form region of weakness, said lands serving, in use, to transmit tension across the width of said region of weakness, and the disposition and spacing of said strain-relief zones being such that the lands between successive zones spaced lengthwise of the region of weakness at one side of the width of the region of weakness are interrupted across the width of the region of weakness by a strain-relief zone (40) thereby defining a lateral diversion of the direction of tension transmission through the stencil between the mounting apertures (26) at said two peripheral regions of the stencil.

2. The stencil of claim 1, wherein said strain-relief zones comprise holes (40) formed in said stencil.

3. The stencil of claim 1, wherein said strain-relief zones comprise etched zones formed with a reduced cross-sectional area of said foil.

4. The stencil of claim 1, wherein said strain-relief zones of each region of weakness in said stencil comprise three rows of strain relief zones, said rows extending lengthwise of the regions of weakness and the strain-relief zones of each row being offset lengthwise of the row with respect to the strain relief zones of the adjacent row.

5. A stencil for mounting in tension on a mount therefor, said stencil comprising:

a) a body portion to receive a stencil pattern;

b) at least two peripheral regions defining opposite sides of said body portion and adapted to be held in said mount for the application of tension to said body portion;

c) a region of weakness formed in a defined location of said stencil and located inwardly of one of said peripheral regions, to relieve strain in said stencil in use;

characterised by d) said stencil comprising a stencil foil comprising a thin metallic sheet adapted to be directly mounted on said mount;

e) said stencil foil being adapted for use in a self-tensioning mount or frame and comprising a row of mounting apertures formed in said foil at said at least two peripheral regions of said stencil and extending lengthwise thereof to cooperate with corresponding mounting pins of said mount or frame, whereby said stencil foil can be stored separately from said mount and then mounted thereon; and f) said region of weakness comprising a band of small diameter holes located between said row of mounting apertures and the part of said body portion to receive or having said stencil pattern, and said region of weakness extending across the full width of said stencil at said relevant peripheral region thereof in the form of a band to relieve the strain in said stencil foil produced by said mounting pins and mounting apertures upon self-tensioning of said stencil by said mount or frame, said band of small diameter holes comprising a plurality of parallel rows of small diameter holes.

6. The stencil of claim 5, wherein each one of said plurality of parallel rows of small diameter holes is offset lengthwise with respect to each adjacent one of said plurality of parallel rows of small diameter holes.

* * * * *